United States Patent
Buller

(10) Patent No.: US 7,105,844 B2
(45) Date of Patent: Sep. 12, 2006

(54) METHOD FOR ELIMINATING LOW FREQUENCY ERROR SOURCES TO CRITICAL DIMENSION UNIFORMITY IN SHAPED BEAM WRITING SYSTEMS

(75) Inventor: Benyamin Buller, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/996,020

(22) Filed: Nov. 22, 2004

(65) Prior Publication Data

US 2006/0108547 A1    May 25, 2006

(51) Int. Cl.
*H01J 37/08* (2006.01)
*G21K 5/10* (2006.01)

(52) U.S. Cl. ............... 250/492.23; 382/266; 358/3.26; 358/275

(58) Field of Classification Search ............ 250/492.23
See application file for complete search history.

(56) References Cited

U.S. PATENT DOCUMENTS

| | | | |
|---|---|---|---|
| 5,876,902 | A | 3/1999 | Veneklasen et al. |
| 6,262,429 | B1 | 7/2001 | Rishton et al. |
| 6,274,290 | B1 | 8/2001 | Veneklasen et al. |
| 2002/0104970 | A1 | 8/2002 | Winter et al. |
| 2003/0107770 | A1* | 6/2003 | Klatchko et al. .......... 358/3.21 |
| 2003/0183782 | A1 | 10/2003 | Veneklasen et al. |
| 2003/0230727 | A1 | 12/2003 | Tingay et al. |
| 2004/0089822 | A1 | 5/2004 | Ogasawara |

OTHER PUBLICATIONS

Thomson, et al., "Double-aperture method of producing variably shaped writing spots for electron Lithograph", J. Vac. Sci. Technol., 15(3), May/Jun. 1978. pp. 891-895.*
LaPedus, Mark, "Applied to revamp e-beam strategy with new tool", http://www.siliconstrategies.com/article/showArticle.jhtml?articleId=1080604010/02/2002.
LaPedus, Mark, "Applied readies laser tool, e-beam for advanced masks", http://www.siliconstrategies.com/article/showArticle.jhtml?articleId=47900243, Sep. 19, 2004.
Nakagawa, et al., "Development of the JBX-3030MV Mask Making E-Beam Lithography System", *Semiconductor Equipment Division, JEOL Ltd.*, JEOL News. vol. 38 No. 1 (2003) pp. 32-35.
Pfeiffer, H.C., "Variable spot shaping for electron-beam lithography", J. Vac. Sci. Technol., 15(3), May/Jun. 1978.
Pfeiffer, et al., "Advanced Mask-Making with a Variable-Shaped Electron Beam", Semiconductor Febtech pp. 129-134.
Saitou, et al., "A high-speed, high-precision electron beam lithography system (electron optics)", J. Vac. Sci. Technol., B 3(1), Jan./Feb. 1985.
Thomson, et al., "Double-aperture method of producing variably shaped writing spots for electron lithography", J. Vac. Sci. Technol., 15(3), May/Jun. 1978.

* cited by examiner

*Primary Examiner*—Kiet T. Nguyen
*Assistant Examiner*—James J. Leybourne
(74) *Attorney, Agent, or Firm*—Patterson & Sheridan LLP

(57) ABSTRACT

A method and system for generating flashes on a substrate. The method includes receiving one or more figures of a pattern to be printed on the substrate and decomposing each figure into at least four substantially rectangular shapes. The four substantially rectangular shapes are separated by at least one horizontal boundary and at least one vertical boundary. The method further includes generating a flash for each substantially rectangular shape such that each edge of each figure is an image of the same aperture.

22 Claims, 5 Drawing Sheets

EFFECT OF DRIFT BETWEEN APERTURES

METHOD FOR ELIMINATING LOW FREQUENCY ERROR SOURCES TO CRITICAL DIMENSION UNIFORMITY IN SHAPED BEAM WRITING SYSTEMS

BACKGROUND OF THE INVENTION

1. Field of the Invention

Embodiments of the present invention generally relate to lithography and to electron (or other energy) beam columns, and more specifically to a writing technique using variable shaped beams.

2. Description of the Related Art

It is well known in the field of lithography (pattern generation) that it is desirable to increase the accuracy of pattern generation systems. Two main applications for such pattern generation systems are making masks for use in semiconductor fabrication by electron beam lithography and electron beam direct writing of patterns onto wafers to form semiconductor devices.

Lithography systems generate or expose patterns by controlling the flow of energy (the beam) from a source to a substrate coated with a layer sensitive to that form of energy. Pattern exposure is controlled and broken into discrete units commonly referred to as flashes, wherein a flash is that portion of the pattern exposed during one cycle of an exposure sequence. Flashes are produced by allowing energy from the source, for example light, electron or other particle beams, to reach the coated substrate within selected pattern areas. The details of flash composition, dose and exposure sequence used to produce a pattern, and hence the control of the lithographic system, are generally known as a writing strategy.

Often times, however, the beam and/or the apertures used in connection with generating the beam may drift over time and move due to noise, thereby negatively affecting critical dimension uniformity of the figures associated with the pattern. Such negative effects may commonly be referred to as critical dimension uniformity errors. Such errors may be caused by a number of factors, such as shaping electronic noise, noise due to aperture and column mechanical vibrations, beam noise due to magnetic field radiation, beam drift, random errors in the electron dose and vector electronics noise.

Since slowly varying noise and drift are often related to environmental conditions that are only partially under control, a need exists in the art for a method and system for a writing strategy that mitigates critical dimension uniformity errors caused by the drifts and low frequency noises.

SUMMARY OF THE INVENTION

One or more embodiments of the invention are directed to a method for generating flashes on a substrate. The method includes receiving one or more figures of a pattern to be printed on the substrate and decomposing each figure into at least four substantially rectangular shapes. The four substantially rectangular shapes are separated by at least one horizontal boundary and at least one vertical boundary. The method further includes generating a flash for each substantially rectangular shape such that each edge of each figure is an image of the same aperture.

One or more embodiments of the invention are also directed to an apparatus for writing flashes on a substrate. The apparatus includes a data processing system configured to receive one or more figures of a pattern and decompose each figure into at least four substantially rectangular shapes. The substantially rectangular shapes are separated by at least one horizontal boundary and at least one vertical boundary. The apparatus further includes a flash generator coupled to the data processing system. The flash generator is configured to generate signals that control an operation of one or more deflectors of an electron beam column. The apparatus further includes the electron beam column having a first aperture and a second aperture. The electron beam column is coupled to the flash generator. The electron beam column is configured to generate a flash for each substantially rectangular shape in response to the generated signals such that each edge of each figure is an image of the first aperture.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
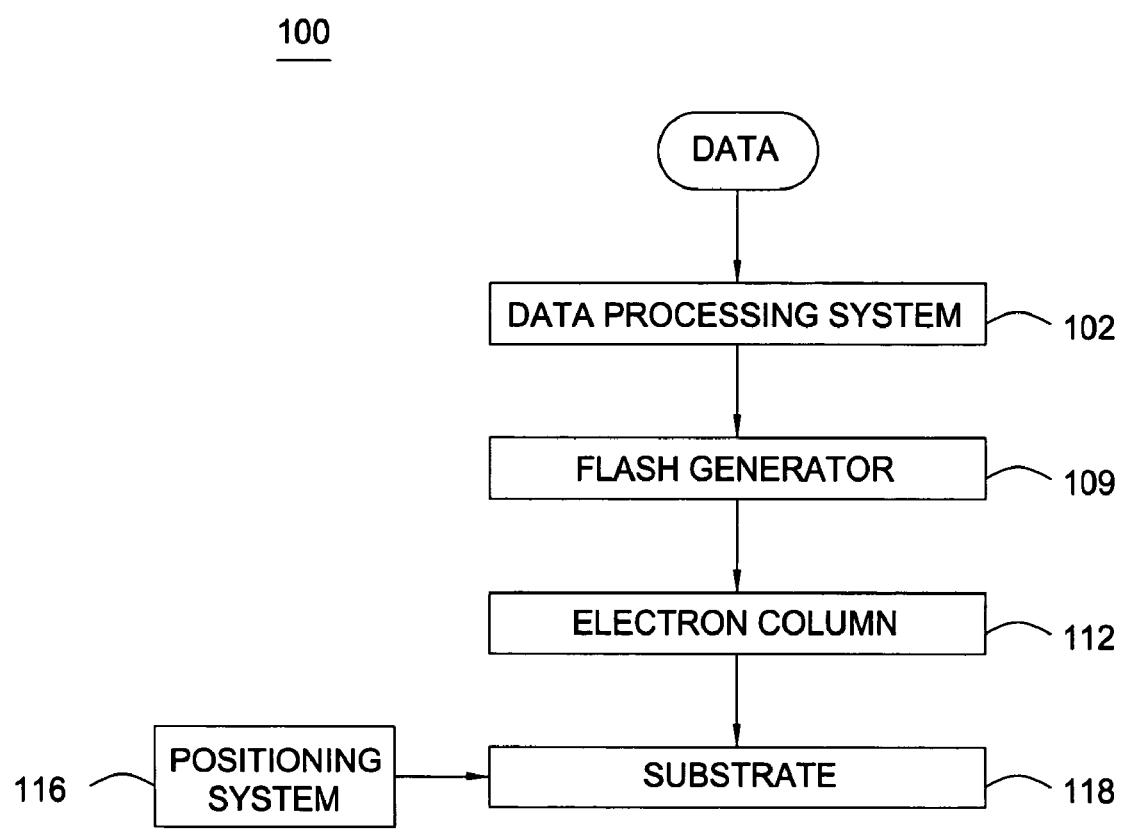
FIG. 1 illustrates a block diagram of a lithography (imaging) system in accordance with one or more embodiments of the invention.

FIG. 1 illustrates a block diagram of a lithography (imaging) system 100 in which one or more embodiments of the invention may be implemented. The system 100 includes a data processing system 102, a flash generator 109, an electron beam column 112 and a positioning system 116.

The data processing system 102 is configured to receive data representing a pattern to be written onto a substrate 118, e.g., a mask. Such data may include figures in a geometrical representation format, such as MEBES, GSDII, OASIS and the like. In response to receiving the figures, the data processing system 102 decomposes or converts each figure into at least four rectangles, wherein the rectangles are separated by at least one horizontal boundary ("horizontal divisional boundary") and at least one vertical boundary ("vertical divisional boundary"). Each rectangle is considered to be used as a primitive that can be printed on the substrate 118. Further, each side of each rectangle is identified or marked as either internal or external. An external side is defined as a side that corresponds to an edge of a figure, wherein an edge is defined as an external boundary of the figure printable on the substrate 118. An internal side is defined as a side that corresponds to either the horizontal divisional boundary or the vertical divisional boundary. Accordingly, an internal side does not correspond to an edge of a figure. Although one or more embodiments of the invention are described with reference to rectangles, other embodiments of the invention contemplate other geometrical shapes, such as triangles.

Figure 4A:
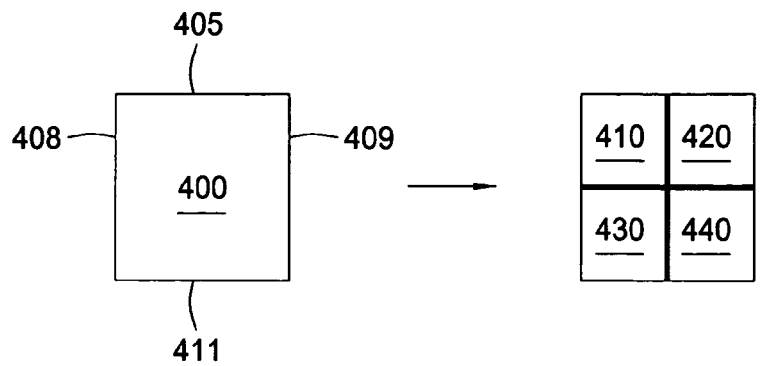
FIG. 4A illustrates an example of a pattern figure that is to be decomposed into four rectangles in accordance with one embodiment of the invention.
Figure 4A:
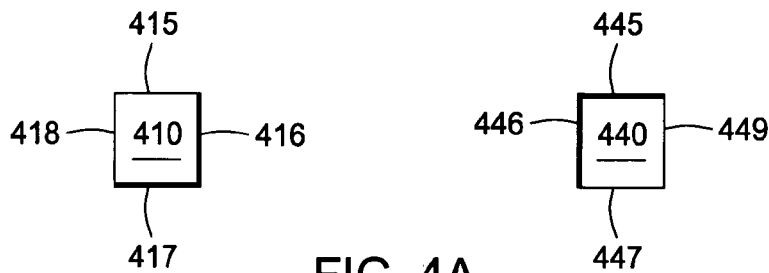

FIG. 4A illustrates an example of a figure 400 that is to be decomposed into four rectangles, i.e., 410–440, in accordance with one embodiment of the invention. Each rectangle has four sides. However, only two of the sides correspond to an edge of the figure 400, wherein an edge is defined as an external boundary of the figure 400. For example, only sides 415 and 418 of rectangle 410 correspond to edges 405 and 408 of figure 400, respectively. Thus, sides 415 and 418 of rectangle 410 are identified as external sides, while sides 416 and 417 of rectangle 410 are identified as internal sides. Likewise, only sides 447 and 449 of rectangle 440 correspond to edges 409 and 411 of pattern figure 400, respectively. Thus, sides 447 and 449 of rectangle 440 are identified as external sides, while sides 446 and 445 of rectangle 440 are identified as internal sides. In one embodiment, the two sides that correspond to the edge of the figure 400 are adjacent to each other.

Figure 2:
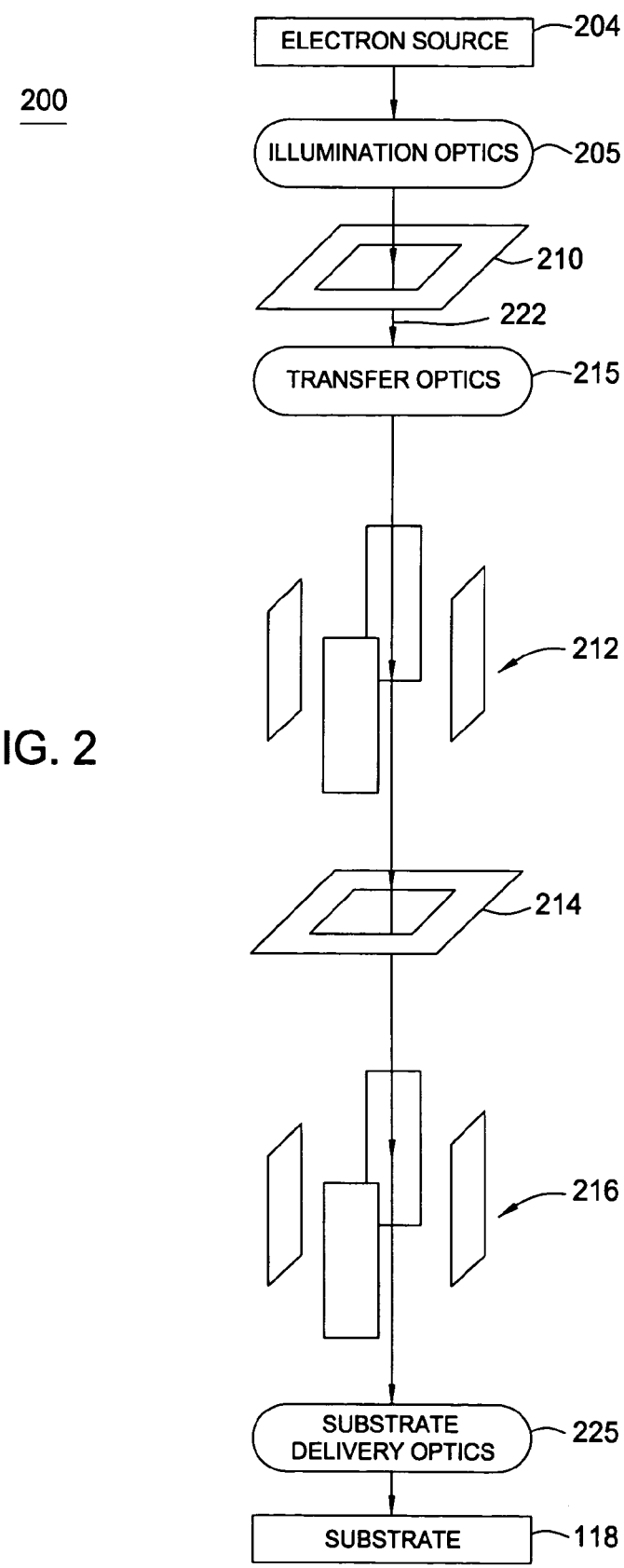
FIG. 2 illustrates a schematic diagram of an electron beam column in connection with one or more embodiments of the invention.

Referring back to FIG. 1, the flash generator 109 is configured to use the rectangles and various descriptors associated with the rectangles to generate signals (e.g., voltage signals) that control the operation of the electron beam column 112, and more specifically, the shape deflector 212 and the vector deflector 216 (shown in FIG. 2). In addition to descriptors for identifying each side of each rectangle as either internal or external, the various descriptors associated with the rectangles may include information regarding the vertical size and horizontal size of each rectangle and the vertical offset and horizontal offset of each rectangle. The vertical offset is defined as the desired position of the bottom side of the rectangle within the vector field. The vector field is the area on the substrate within which a rectangle can be positioned by the vector deflector. The horizontal offset is defined as the desired position of the left side of the rectangle within the vector field.

The electron beam column 112 is configured to generate a flash for each rectangle according to the signals generated by the flash generator 109. Although embodiments of the invention are described with reference to an electron beam column, other embodiments of the invention contemplate the use of other types of beam column, such as an ion beam column, a laser beam column or other energy beam column commonly known by persons of ordinary skill in the art. The electron beam column 112 is described in more detail with reference to FIG. 2.

The positioning system 116 is configured to adjust the positioning of the stage upon which the substrate 118 is disposed and to adjust a position deflector, if such deflector is used in the electron beam column 112.

FIG. 2 illustrates a schematic diagram of an electron beam column 200 in connection with one or more embodiments of the invention. The electron beam column 200 includes an electron beam source 204, an illumination optics 205, an upper aperture 210, a transfer optics 215, a shape deflector 212, a lower aperture 214, a vector deflector 216 and a substrate delivery optics 225. In an alternative embodiment, the electron beam column 200 further includes a blanker deflector positioned between the illumination optics 205 and the upper aperture 210. In yet another alternative embodiment, the electron beam column 200 further includes a position deflector disposed between the substrate delivery optics 225 and the substrate 118.

The electron beam source 204 is configured to generate an electron beam 222. The electron beam source 204 may be a thermal field emission source, thermal emission source or field emission source.

The illumination optics 205 are configured to assist the electron beam source 204 illuminate the upper aperture 210, while the transfer optics 215 is configured to project the electron beam through the upper aperture 210 on the lower aperture 214. The substrate delivery optics 225 is configured to project the generated flash on the substrate 118. The upper aperture 210 and the lower aperture 214 are configured to form the shape of the electron beam 222. In one embodiment, each aperture defines a square opening.

The shape deflector 212 and the vector deflector 216 are configured to shape the electron beam 222 in response to the signals generated by the flash generator 109. More specifically, the shape deflector 212 is configured to move the electron beam 222 such that the overlap of the image or shadow of the upper aperture 210 with the lower aperture 214 can be modified. The electron beam 222 that passes through the lower aperture 214 has the shape of the overlap of the image of the upper aperture 210 with the lower aperture 214. In this manner, the shape deflector 212 is configured to shape the electron beam 222. The vector deflector 216 is configured to move the shaped beam to the desired location on the substrate 118. The movement and shaping of the electron beam 222 is provided in more details with reference to FIG. 3 in the paragraphs below.

Figure 3:
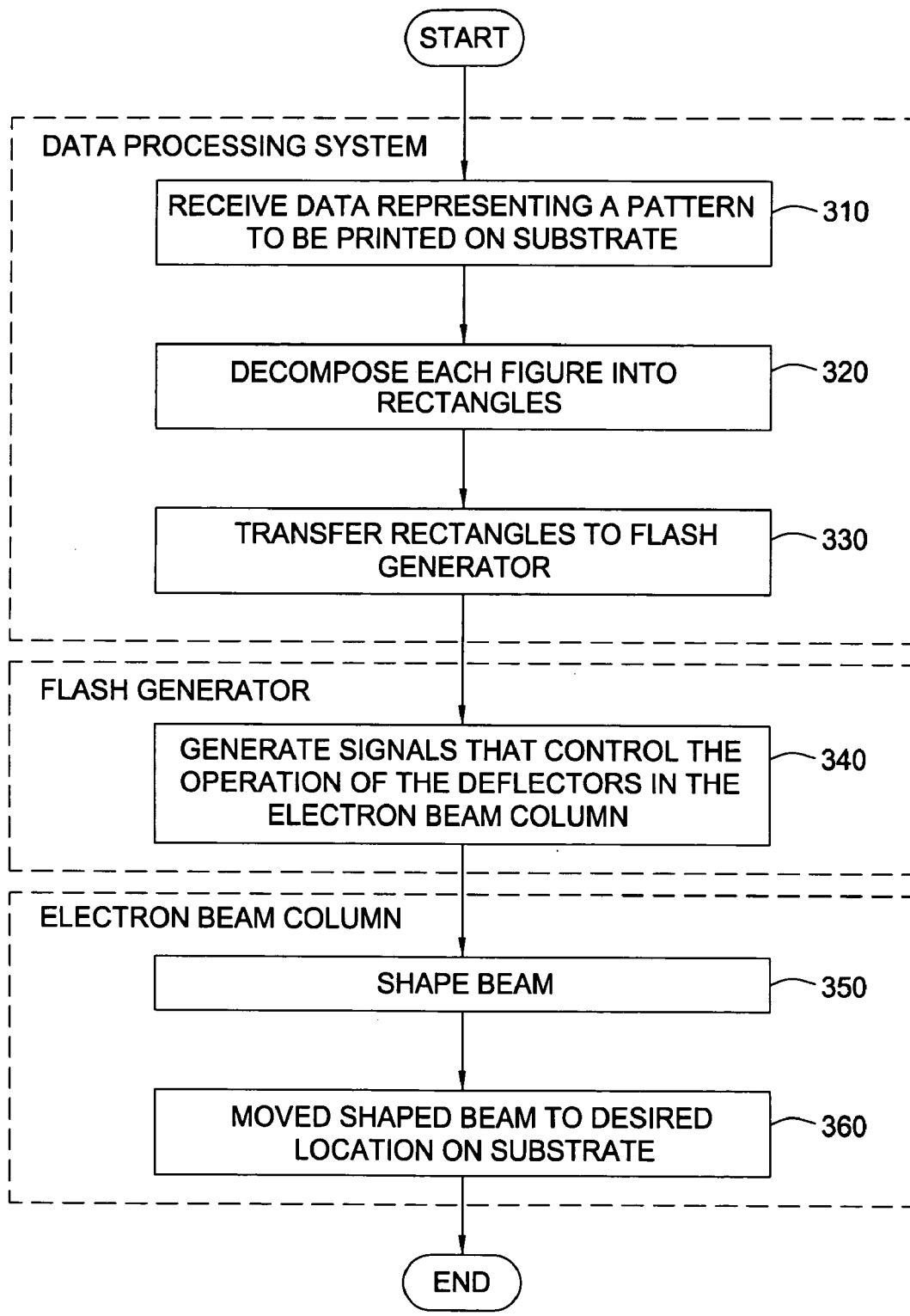
FIG. 3 illustrates a flow diagram of a writing strategy for the lithography (imaging) system in accordance with one or more embodiments of the invention.

FIG. 3 illustrates a flow diagram of a writing strategy for the lithography (imaging) system 100 in accordance with one or more embodiments of the invention. At step 310, the data processing system 102 receives a plurality of figures representing a pattern to be written onto the substrate 118. At step 320, each figure is decomposed into at least four rectangles, wherein the rectangles are separated by at least one horizontal divisional boundary and at least one vertical divisional boundary. As mentioned above, each rectangle is considered to be used as a primitive that can be printed on the substrate 118. At step 330, the data processing system 102 transfers the rectangles along with descriptors associated with the rectangles to the flash generator 109. Such descriptors include those that identify each side of each rectangle as either internal or external, the vertical size and horizontal size of each rectangle, and the vertical offset and horizontal offset of each rectangle.

Upon receipt of the rectangles and their associated descriptors, the flash generator 109 generates signals that control the operation of the shape deflector 212 and the vector deflector 216 (step 340). At step 350, the shape deflector 212 shapes the electron beam 222 according to the external and internal side indicators and the horizontal and vertical size of each rectangle. The manner in which those descriptors are used to shape the electron beam 222 is described in more detail below.

Figure 4B:
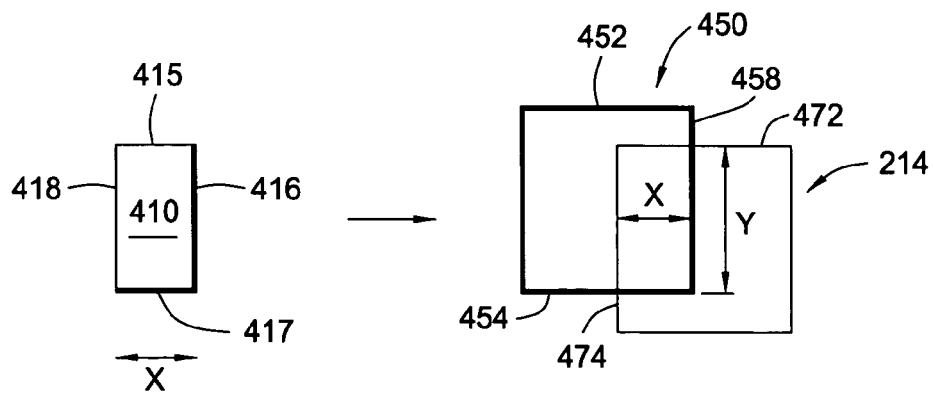
FIG. 4B illustrates the projection of the image through the upper aperture on the lower aperture in accordance with one or more embodiments of the invention.
Figure 4B:
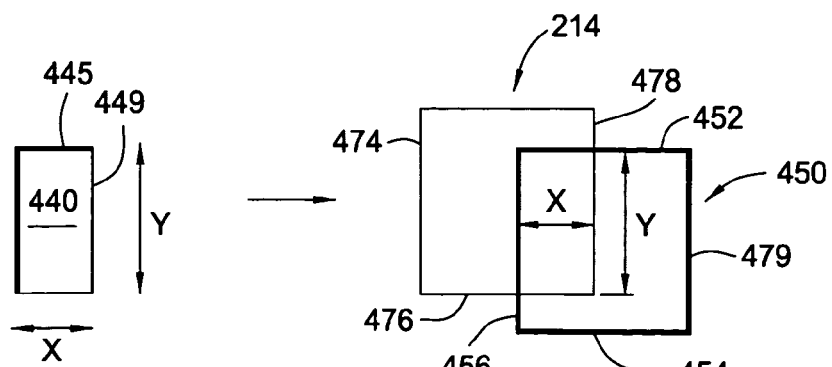

For purposes of illustration, the horizontal size of each rectangle (e.g., rectangles 410, 440) may be represented by X and the vertical size of each rectangle (e.g., rectangles 410, 440) may be represented by Y. If the right side of the rectangle is an internal side, then the electron beam 222 is moved such that the right side of the image of the electron beam 222 through the upper aperture projected on the lower aperture is X distance to the right of the left side of the lower aperture. For example, the right side 416 of rectangle 410 is an internal side. Therefore, the electron beam 222 is shaped or moved such that the right side 458 of the projected image 450 is positioned X distance to the right of the left side 474 of the lower aperture 214, as illustrated in FIG. 4B.

On the other hand, if the right side of the rectangle is an external side, then the electron beam 222 is moved such that the left side of the image of the electron beam 222 through the upper aperture projected on the lower aperture is X distance to the left of the right side of the lower aperture. For example, the right side 449 of rectangle 440 is an external side. Therefore, the electron beam 222 is moved such that the left side 456 of the projected image 450 is positioned X distance to the left of the right side 478 of the lower aperture 214, as illustrated in FIG. 4B.

If the top side of the rectangle is an internal side, then the electron beam 222 is moved such that the top side of the image of the electron beam 222 through the upper aperture projected on the lower aperture is Y distance above the bottom side of the lower aperture. For example, the top side 445 of rectangle 440 is an internal side. Therefore, the electron beam 222 is moved such that the top side 452 of the projected image 450 is positioned Y distance above the bottom side 476 of the lower aperture 214, as illustrated in FIG. 4B.

If the top side of the rectangle is an external side, then the electron beam 222 is moved such that the bottom side of the image of the electron beam 222 through the upper aperture projected on the lower aperture is Y distance below the top side of the lower aperture. For example, the top side 415 of rectangle 410 is an external side. Therefore, the electron beam 222 is moved such that the bottom side 454 of the projected image 450 is positioned Y distance below the top side 472 of the lower aperture 214, as illustrated in FIG. 4B.

Referring back to FIG. 3, at step 360, the vector deflector 216 moves the shaped electron beam according to the horizontal and vertical offsets. If the top side of the rectangle is an internal side, then the shaped electron beam is moved by the vertical offset in the vertical direction. On the other hand, if the top side of the rectangle is an external side, then the shaped electron beam is moved by the vertical offset—(vertical aperture size—vertical size) in the vertical direction. In both cases, the resultant is that the bottom side of the rectangle is positioned at the desired vertical offset.

If the right side of the rectangle is an internal side, then the shaped electron beam is moved by the horizontal offset in the horizontal direction. On the other hand, if the right side of the rectangle is an external side, then the shaped electron beam is moved by the horizontal offset—(horizontal aperture size—horizontal size) in the horizontal direction. In both cases, the resultant is that the left side of the rectangle is positioned at the desired horizontal offset.

In this manner, the descriptors associated with each rectangle are used to generate flashes of the rectangles on the substrate 118. The flashes are generated in a manner such that the edges of each figure are an image of the same aperture, e.g., the lower aperture 214. Although one of more embodiments of the invention are described with reference to the lower aperture 214, other embodiments of the invention contemplate the use of the upper aperture 210.

Figure 5:
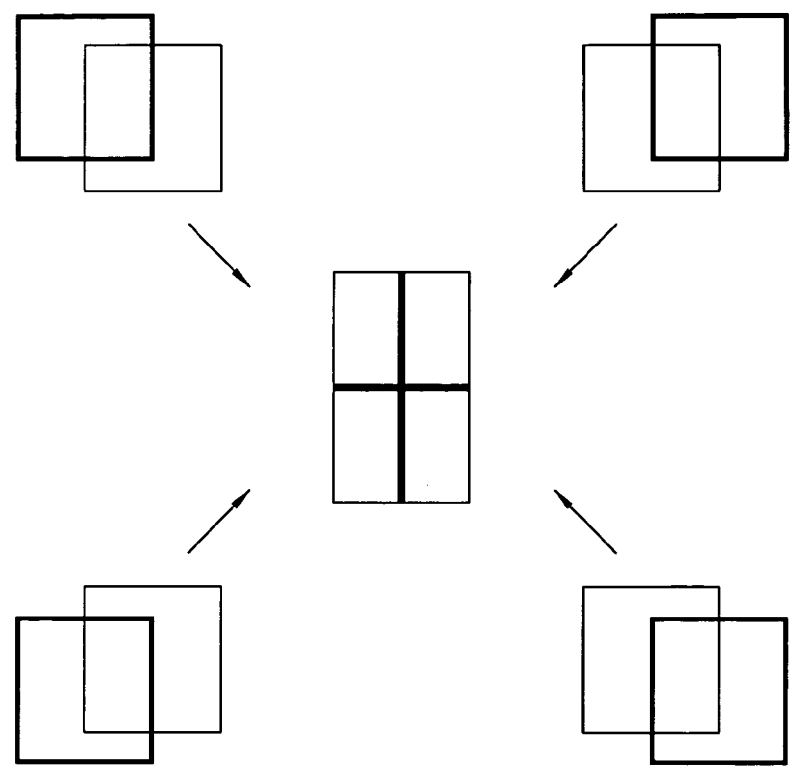
FIG. 5 illustrates the effect of drifts on a pattern figure printed using one or more embodiments of the present invention.
Figure 5:
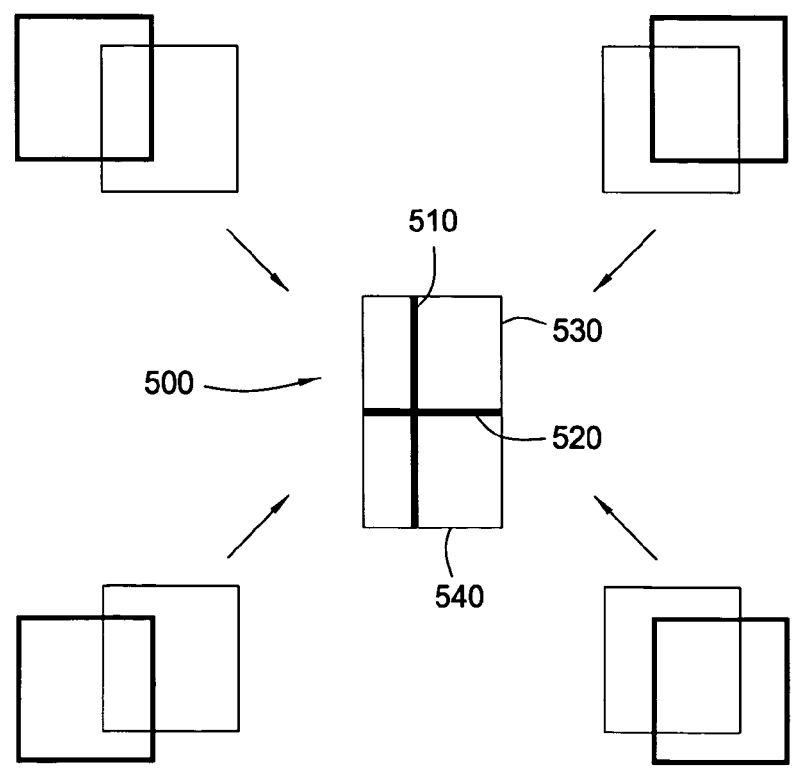

One of the advantages of the present invention includes reduction of critical dimension uniformity errors that may be caused by drifts, as well as other slowly varying noise sources, such as mechanical vibrations and magnetic field radiation. FIG. 5 illustrates the effect of drifts on a pattern figure 500 printed using one or more embodiments of the present invention. Figure 500 is printed using four rectangles using the writing strategy described with reference to FIG. 3. The printed figure has vertical divisional boundary 510 and horizontal divisional boundary 520 and edges 530 and 540. If the electron beam drifts between the apertures, only the divisional boundaries 510 and 520 change position, while the edges 530 and 540 remain the same, thereby leaving the size of pattern figure 500 unchanged. In one embodiment, the invention assumes that the time within which the different rectangles are written is substantially shorter relative to the rate of the low frequency noise and drift sources.

While the foregoing is directed to embodiments of the present invention, other and further embodiments of the invention may be devised without departing from the basic scope thereof, and the scope thereof is determined by the claims that follow.

What is claimed is:

1. A method for generating flashes on a substrate, comprising:
   receiving one or more figures of a pattern to be printed on the substrate;
   decomposing each figure into at least four substantially rectangular shapes, wherein the four substantially rectangular shapes are separated by at least one horizontal boundary and at least one vertical boundary; and
   generating a flash for each substantially rectangular shape, wherein the flashes are generated to form each figure such that the edges of each figure are an image of a first aperture.

2. The method of claim 1, further comprising forwarding the at least four substantially rectangular shapes and information associated therewith to a flash generator, wherein the information comprises at least one of a side descriptor for identifying each side of each substantially rectangular shape as one of internal and external, a vertical size and a horizontal size of each substantially rectangular shape, and a vertical offset and a horizontal offset of each substantially rectangular shape, wherein an internal side is defined as a side that does not correspond to an edge of a figure and an external side is defined as a side that corresponds to an edge of a figure.

3. The method of claim 2, wherein generating the flash comprises generating the flash for each substantially rectangular shape using the information associated with the substantially rectangular shape.

4. The method of claim 2, wherein generating the flash comprises shaping an electron beam such that an image of an upper aperture is imaged on a lower aperture according to at least one of the side descriptor, the vertical size and the horizontal size of the substantially rectangular shape.

5. The method of claim 4, wherein generating the flash comprises moving the shaped electron beam according to the horizontal offset and the vertical offset.

6. The method of claim 5, wherein moving the shaped electron beam comprises moving the shaped electron beam vertically by the vertical offset, if a top side of the substantially rectangular shape is identified as internal.

7. The method of claim 5, wherein moving the shaped electron beam comprises moving the shaped electron beam vertically by the vertical offset minus a vertical size of the lower aperture, if a top side of the substantially rectangular shape is identified as external.

8. The method of claim 5, wherein moving the shaped electron beam comprises moving the shaped electron beam horizontally by the horizontal offset, if a right side of the substantially rectangular shape is identified as internal.

9. The method of claim 5, wherein moving the shaped electron beam comprises moving the shaped electron beam horizontally by the horizontal offset minus a horizontal size of the lower aperture, if a right side of the substantially rectangular shape is identified as external.

10. The method of claim 4, wherein shaping the electron beam comprises moving the electron beam such that a right side of the image projected on the lower aperture is a horizontal size distance to the right of a left side of the lower aperture, if a right side of the substantially rectangular shape is identified as internal.

11. The method of claim 4, wherein shaping the electron beam comprises moving the electron beam such that a left side of the image projected on the lower aperture is a horizontal size distance to the left of a right side of the lower aperture, if a right side of the substantially rectangular shape is identified as external.

12. The method of claim 4, wherein shaping the electron beam comprises moving the electron beam such that a top side of the image projected on the lower aperture is a vertical size distance above a bottom side of the lower aperture, if a top side of the substantially rectangular shape is identified as internal.

13. The method of claim 4, wherein shaping the electron beam comprises moving the electron beam such that a bottom side of the image projected on the lower aperture is a vertical size distance below a top side of the lower aperture, if a top side of the substantially rectangular shape is identified as external.

14. The method of claim 1, further comprising generating signals that control an operation of at least one of a shape deflector and a vector deflector.

15. The method of claim 1, wherein the first aperture is a lower aperture.

16. The method of claim 1, wherein the first aperture is an upper aperture.

17. An apparatus for writing flashes on a substrate, comprising:
   a data processing system configured to receive one or more figures of a pattern and decompose each figure into at least four substantially rectangular shapes, wherein the substantially rectangular shapes are separated by at least one horizontal boundary and at least one vertical boundary;
   a flash generator coupled to the data processing system, wherein the flash generator is configured to generate signals that control an operation of one or more deflectors of an energy beam column; and
   an energy beam column having a first aperture and a second aperture, wherein the energy beam column is coupled to the flash generator and wherein the energy beam column is configured to generate a flash for each substantially rectangular shape in response to the generated signals, wherein the flashes are generated to form each figure such that the edges of each figure are an image of the first aperture.

18. The apparatus of claim 17, wherein the data processing system is further configured to forward the at least four substantially rectangular shapes and information associated therewith to the flash generator, wherein the information comprises at least one of a side descriptor for identifying each side of each substantially rectangular shape as one of internal and external, a vertical size and a horizontal size of each substantially rectangular shape, and a vertical offset and a horizontal offset of each substantially rectangular shape, wherein an internal side is defined as a side that does not correspond to an edge of a figure and an external side is defined as a side that corresponds to an edge of a figure.

19. The apparatus of claim 18, wherein the energy beam column comprises a shape deflector configured to shape an energy beam such that an image of the second aperture is projected on the first aperture according to at least one of the side descriptor, the vertical size and the horizontal size.

20. The apparatus of claim 18, wherein the energy beam column comprises:
   a shape deflector configured to shape an energy beam such that an image of the second aperture is projected on the first aperture according to at least one of the side descriptor, the vertical size and the horizontal size; and
   a vector deflector configured to move the shaped energy beam according to at least one of the horizontal offset and the vertical offset.

21. The apparatus of claim 17, wherein the first aperture is a lower aperture and the second aperture is an upper aperture.

22. The apparatus of claim 17, wherein the energy beam column is selected from the group of an electron beam column, an ion beam column, and a laser beam column.

* * * * *